(12) United States Patent
Han et al.

(10) Patent No.: US 7,135,371 B2
(45) Date of Patent: Nov. 14, 2006

(54) METHODS OF FABRICATING SEMICONDUCTOR DEVICES

(75) Inventors: Chang Hun Han, Gyeonggi-do (KR); Dong Yeal Keum, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 258 days.

(21) Appl. No.: 10/747,602

(22) Filed: Dec. 29, 2003

(65) Prior Publication Data

US 2005/0101092 A1  May 12, 2005

(30) Foreign Application Priority Data

Dec. 31, 2002 (KR) .................. 10-2002-0088276

(51) Int. Cl.
*H01L 21/336* (2006.01)
(52) U.S. Cl. .............. 438/296; 438/424; 438/435; 257/E21.54; 257/E21.545
(58) Field of Classification Search .......... 438/295, 438/267, 400, 424, 585, 770, FOR. 221, 438/FOR. 227, 296, 404, 435; 257/E29.2, 257/E21.54, E21.545, E21.546, E21.548
See application file for complete search history.

(56) References Cited

U.S. PATENT DOCUMENTS

| | | | |
|---|---|---|---|
| 5,597,747 A | * | 1/1997 | Chen .................. 438/30 |
| 6,156,854 A | * | 12/2000 | Shamshoum et al. ......... 526/81 |
| 6,281,082 B1 | | 8/2001 | Chen et al. .................. 438/296 |
| 6,417,097 B1 | * | 7/2002 | Hwang et al. .............. 438/637 |

FOREIGN PATENT DOCUMENTS

EP    0678912 A2    10/1995

* cited by examiner

*Primary Examiner*—Michelle Estrada
*Assistant Examiner*—Quovaunda Jefferson
(74) *Attorney, Agent, or Firm*—Saliwanchik, Lloyd & Saliwanchik

(57) ABSTRACT

Methods of fabricating semiconductor devices are disclosed. One example method includes forming a gate oxide and a gate electrode on a semiconductor substrate; performing a first ion implantation process for the formation of an LDD (lightly doped drain) region in the substrate; forming spacers on the sidewalls of the gate electrode; performing a second ion implantation process for the formation of a junction region in the substrate using the spacers as mask; forming a trench for device isolation by removing selectively the top portion of the substrate between the spacers; forming a sidewall oxide layer on the resulting substrate; forming a diffusion barrier on the sidewall oxide layer; depositing a gap filling insulation layer over the diffusion barrier; planarizing the gap filling insulating layer; and removing selectively some part of the gap filling insulation layer to form contact holes.

6 Claims, 2 Drawing Sheets

METHODS OF FABRICATING SEMICONDUCTOR DEVICES

TECHNICAL FIELD

The present invention relates to semiconductors and, more particularly, to methods of fabricating semiconductor devices.

BACKGROUND

A conventional fabricating method of a transistor comprises forming shallow trench isolation (STI) structures and filling the STI structures. The method may also include performing a chemical mechanical polishing (CMP) process, forming a gate electrode, and depositing an interlayer insulation layer.

For example, U.S. Pat. No. 6,281,082 to Chen et al. discloses a method of forming metal oxide semiconductor (MOS) transistors with a common shallow trench isolation and interlevel dielectric gap fill. The Chen et al. patent forms trenches and, then, forming gate electrodes. Here, spacers are formed in the trenches to fill easily the trenches.

FIG. 1 illustrates a cross-sectional view of a semiconductor device according to a convention fabricating method. STIs are formed in a semiconductor substrate 1 through an etching process and filled with oxide. A CMP process is performed to form trench-type device isolation layers 3. Next, a gate oxide layer 5 and a gate polysilicon layer 7 are formed on the semiconductor substrate 1 including the device isolation layers 3. An ion implantation process 9 for the formation of a lightly doped drain (LDD) is performed using the gate polysilicon layer 7 as a mask. A tetraethyl orthosilicate (TEOS) //SiN/TEOS layer is formed over the resulting substrate 1. Spacers 11 are formed through an etching process for the TEOS/SiN/TEOS layer. Next, an ion implantation process 13 for the formation of junction region is performed using the spacers 11 as a mask. Finally, an insulating layer 15 is deposited over the resulting substrate 1 and etched to form metal contact holes 17.

However, such a conventional method includes a first planarization process after the deposition of a gap filling oxide layer in trenches and a second planarization process after the deposition of an interlayer insulation layer and, therefore complicates the fabricating process. In addition, a pad nitride layer and a pad oxide layer have to be necessarily formed in the conventional method. However, when a CMP process is applied to the substrate including the pad nitride layer and the pad oxide layer, a residual nitride layer may be generated and the pad oxide layer may be damaged. The residual nitride layer and the damage of pad oxide layer may deteriorate circuit performance and reduce a device yield as the pitch between metals is reduced more and more due to high-integration. Moreover, the conventional method increases manufacturing costs due to complex fabricating steps.

DETAILED DESCRIPTION

Figure 1:
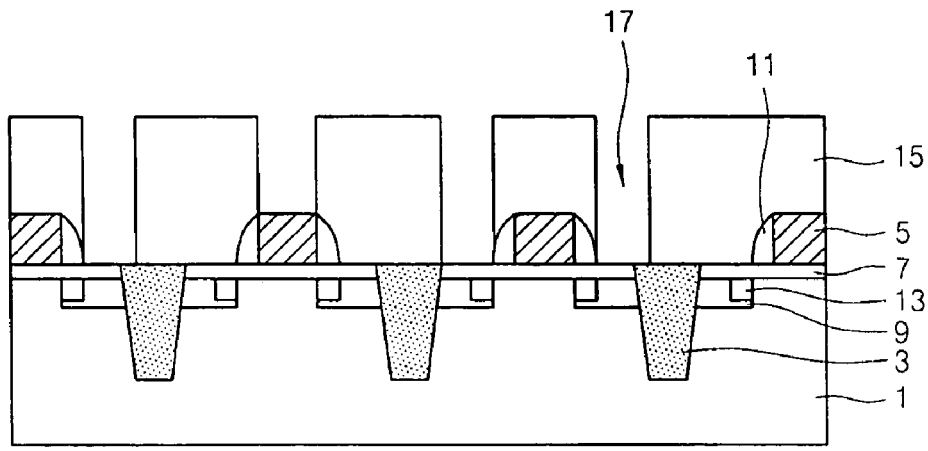
FIG. 1 illustrates a cross-sectional view of a semiconductor device produced according to a convention fabricating method.
Figure 2A:
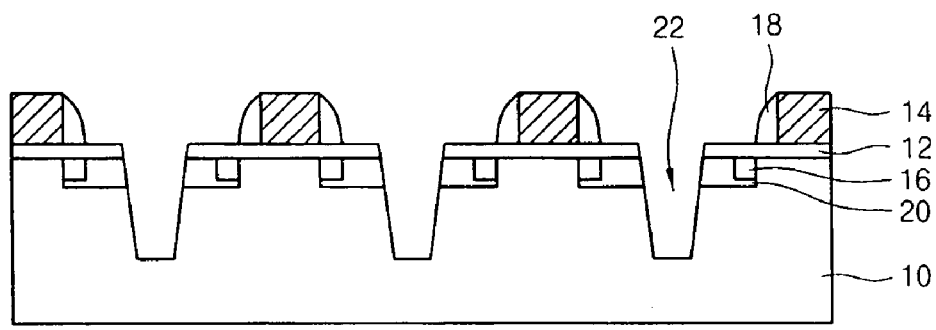
FIGS. 2a through 2e illustrate, in cross-sectional views, the results of the disclosed example a semiconductor device fabricating process.

Referring to FIG. 2a, a gate oxide layer 12 and a gate polysilicon layer 14 are formed in sequence on a semiconductor substrate 10. A first ion implantation process 16 for the formation of an LDD region is performed using the gate polysilicon layer 14 as a mask. A TEOS/SiN/TEOS layer is deposited on the resulting substrate 10. Spacers 18 are formed on the sidewalls of the gate polysilicon layer 14 through an etching process. A second ion implantation process 20 for the formation of a junction region is performed using the spacers 18 as a mask. Then, a trench 22 for device isolation is formed through removing the top portion of the substrate by an anisotropic etching process.

Figure 2B:
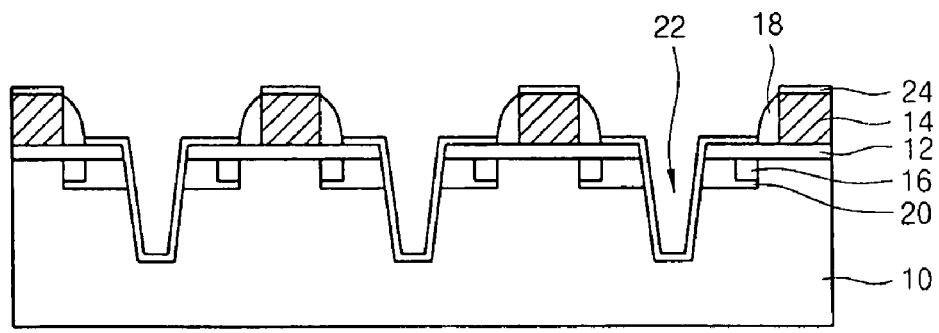

Referring to FIG. 2b, an oxide layer 24 is provided to prevent the substrate from being damaged during the etching process is deposited on the resulting substrate 10.

Figure 2C:
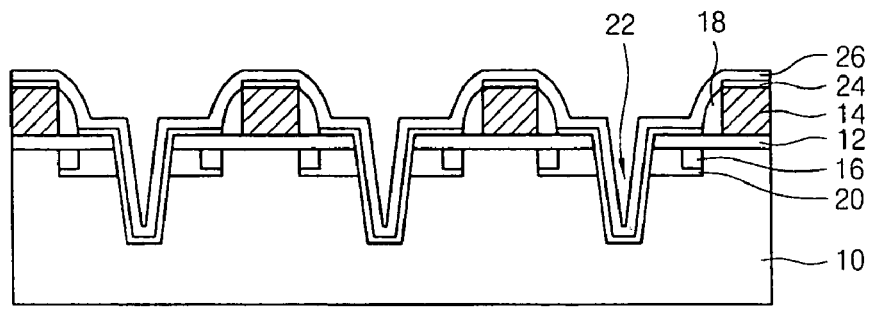

Referring to FIG. 2c, a diffusion barrier 26 is deposited on the oxide layer 24. The diffusion barrier 26 is used to prevent boron of the BPSG (boro-phosphosilicate glass) layer, which is formed as an interlayer insulation layer in a following process, from being diffused into the junction region and the channel region. The diffusion barrier may be, for example, amorphous silicon. Alternatively, the diffusion barrier may be an N-doped oxide layer.

Figure 2D:
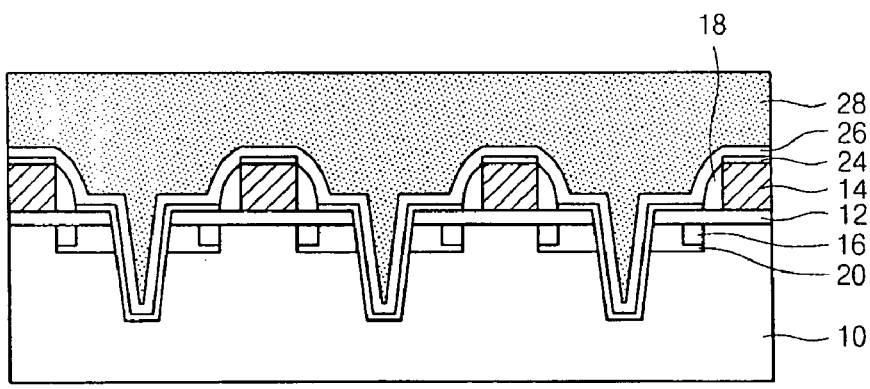

Referring to FIG. 2d, an interlayer insulation layer 28 is deposited over the diffusion barrier 26 and is planarized. The trench 22 is filled with the interlayer insulation layer 28. Here, the interlayer insulation layer 26 is used as both a device isolation layer and an interlayer insulation layer. The interlayer insulation layer 28 may be formed of oxide such as BPSG. Alternatively, for example, the interlayer insulation layer 28 may be formed of USG (undoped silicate glass).

Figure 2E:
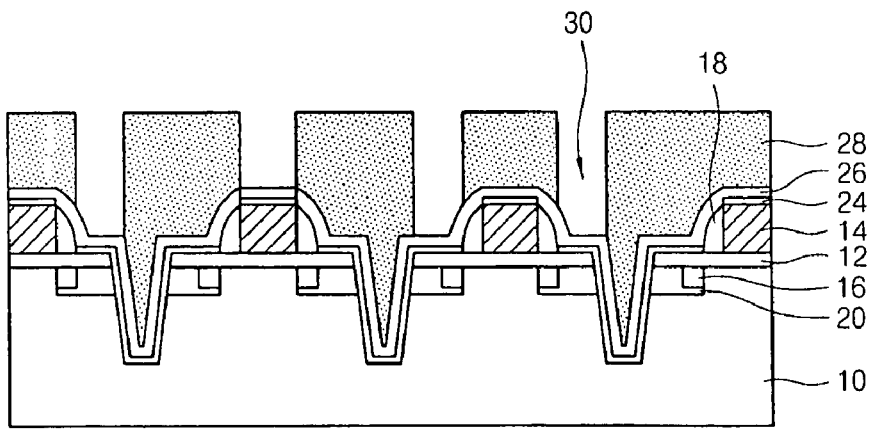

Referring to FIG. 2e, a mask pattern is formed over the interlayer insulation layer 28. Then, some part of the interlayer insulation layer 28 is removed through an etching process using the mask pattern as a mask to form contact holes 30.

The disclosed example methods can reduce the cost associated with a planarization process and the fabricating steps by depositing the gap filling insulation layer and the interlayer insulation layer simultaneously using the same material and performing one planarization process. Accordingly, the example methods disclosed can simplify the fabricating process, enhance production efficiency, and minimize defects due to the planarization process. In addition, by preventing the boron of the BPSG layer from being diffused in the junction region and the channel region using the diffusion barrier, the disclosed example method can improve device reliability.

As disclosed herein, one example method may include forming a gate oxide and a gate electrode on a semiconductor substrate, performing a first ion implantation process for the formation of an LDD region in the substrate, forming spacers on the sidewalls of the gate electrode, and performing a second ion implantation process for the formation of a junction region in the substrate using the spacers as a mask. The example method may also include forming a trench for device isolation by removing selectively the top portion of the substrate between the spacers, forming a oxide layer on the resulting substrate, forming a diffusion barrier on the oxide layer and depositing a gap filling insulation layer over the diffusion barrier. The disclosed example method may further include planarizing the gap filling insulating layer and removing selectively some part of the gap filling insulation layer to form contact holes.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a semiconductor device comprising:

forming a gate oxide and a gate electrode on a semiconductor substrate;

performing a first ion implantation process for the formation of a (lightly doped drain) LDD region in the substrate;

forming spacers on the sidewalls of the gate electrode;

performing a second ion implantation process for the formation of a junction region in the substrate using the spacers as a mask;

forming a trench for device isolation by removing selectively the top portion of the substrate between the spacers;

forming an oxide layer on the whole substrate except on the spacers;

forming a diffusion barrier on the resulting substrate;

depositing a gap filling insulation layer over the diffusion barrier;

planarizing the gap filling insulating layer; and removing selectively some part of the gap filling insulation layer to form contact holes.

2. A method as defined by claim 1, wherein the gap filling insulation layer is formed of boro-phosphosilicate glass (BPSG).

3. A method as defined by claim 1, wherein the diffusion barrier is formed of amorphous silicon.

4. A method as defined by claim 1, wherein the diffusion barrier is an N-doped oxide.

5. A method as defined by claim 1, wherein the gap filling insulation layer is formed of undoped silicate glass (USG).

6. A method as defined by claim 1, wherein the gap filling insulation layer is used as both a device isolation layer and an interlayer insulation layer.

* * * * *